(12) United States Patent
Kong et al.

(10) Patent No.: US 9,459,650 B2
(45) Date of Patent: Oct. 4, 2016

(54) CLOCK PULSE GENERATOR FOR MULTI-PHASE SIGNALING

(71) Applicant: QUALCOMM Incorporated, San Diego, CA (US)

(72) Inventors: Xiaohua Kong, San Diego, CA (US); Cheng Zhong, San Diego, CA (US); Swarna Latha Navubothu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 92 days.

(21) Appl. No.: 14/496,129

(22) Filed: Sep. 25, 2014

(65) Prior Publication Data

US 2015/0261249 A1    Sep. 17, 2015

Related U.S. Application Data

(60) Provisional application No. 61/954,483, filed on Mar. 17, 2014.

(51) Int. Cl.

| | | |
|---|---|---|
| *G06F 1/04* | (2006.01) | |
| *H03K 3/00* | (2006.01) | |
| *H03K 5/01* | (2006.01) | |
| *G11C 11/4076* | (2006.01) | |
| *H04L 25/02* | (2006.01) | |
| *H04L 25/14* | (2006.01) | |
| *H03K 5/00* | (2006.01) | |

(52) U.S. Cl.
CPC ............ *G06F 1/04* (2013.01); *G11C 11/4076* (2013.01); *H03K 5/01* (2013.01); *H04L 25/0292* (2013.01); *H04L 25/14* (2013.01); *H03K 2005/00013* (2013.01)

(58) Field of Classification Search
CPC .................................. G06F 1/04; H03K 5/01
USPC .................................................. 327/291–305
See application file for complete search history.

(56) References Cited

U.S. PATENT DOCUMENTS

| | | | | |
|---|---|---|---|---|
| 5,604,712 A | * | 2/1997 | Priebe | G11C 8/10 365/194 |
| 6,377,079 B1 | * | 4/2002 | Fiedler | H03K 19/018585 326/105 |
| 6,741,668 B1 | | 5/2004 | Nakamura | |
| 8,432,768 B2 | | 4/2013 | Ware et al. | |
| 2004/0017243 A1 | | 1/2004 | Sasaki | |
| 2007/0010961 A1 | * | 1/2007 | Nguyen | H03F 3/19 702/107 |
| 2009/0322399 A1 | | 12/2009 | Kwon et al. | |
| 2014/0071776 A1 | * | 3/2014 | Chong | G11C 11/419 365/194 |
| 2014/0078838 A1 | * | 3/2014 | Gondi | G11C 5/147 365/189.11 |

FOREIGN PATENT DOCUMENTS

EP    0197263 A2    10/1986

OTHER PUBLICATIONS

International Search Report and Written Opinion—PCT/US2015/020234—ISA/EPO—Jun. 16, 2015.
Poriazis S., "The 2-Phase On-demand Delayed Clock Generator," Proceedings 29th International Conference on Microelectronics (MIEL 2014), Belgrade, Serbia, May 12-14, 2014, pp. 393-396.

* cited by examiner

*Primary Examiner* — Lincoln Donovan
*Assistant Examiner* — Metasebia Retebo
(74) *Attorney, Agent, or Firm* — Haynes and Boone, LLP

(57) ABSTRACT

A clock generator is provided that is immune to skew between bits in digital words generated by a multi-phase receiver.

15 Claims, 7 Drawing Sheets

CLOCK PULSE GENERATOR FOR MULTI-PHASE SIGNALING

RELATED APPLICATIONS

This application claims the benefit of U.S. Provisional Application No. 61/954,483, filed Mar. 17, 2014, the contents of which are incorporated by reference herein in their entirety.

TECHNICAL FIELD

This application relates to clock generation, and more particularly to a clock generator for multi-phase signaling.

BACKGROUND

Transmission of multi-bit words typically occurs over multi-wire buses. For example, an eight-bit word may be transmitted over a bus having eight wires, one for each bit. But in such conventional busses, each bit carried on a given wire is independent of the remaining bits. As the data rates increase, such conventional communication becomes problematic in that the various bits in a word become skewed from each other as the word propagates over the bus.

Given the issues with skew between multiple bits in high-speed communication, various serializer/deserializer (SERDES) systems have been developed. A SERDES transmitter serializes a multi-bit word into a series of corresponding bits for transmission to a receiver. There can then be no such skew between adjacent bits on a multi-wire bus since a single transmission line (which may be differential) is used in a SERDES system. The SERDES receiver deserializes the received serial bit stream into the original word. However, the SERDES transmission line and the receiver load introduce distortion as the data transmission rate exceeds, for example, 10 GHz. Adjacent bits in the serial bit stream then begin to interfere with each other. Complicated equalizing schemes become necessary to fight the resulting inter-symbol interference and thus it becomes difficult to push SERDES data transmission rates ever higher.

To increase data transmission rates over the SERDES limitations, a three-phase signaling protocol has been developed in which three transmitters drive three separate transmission lines. The following discussion will be directed to the clock generation upon receipt of signals from current-mode transmitters that either source or receive current but voltage-mode transmission may also be used. Since the net current must be zero, all three transmitters cannot be active (either transmitting or receiving current) in a three transmitter system. Similarly, there must be current injected and received so all three transmitters cannot be inactive for any given symbol. So that means that two of the three transmitters will be active for each symbol, with one sourcing current and the other receiving current. From a set of three transmitters, there are three distinct pairs of transmitters that can be active. Within each pair, there are two possibilities depending upon which transmitter is sourcing versus which transmitter is receiving. There are thus six distinct combinations of two active transmitters each sourcing or receiving a given amount of current in a three-transmitter multi-phase system. Each distinct combination of active transmitters may be denoted as a symbol. Since there are six possible symbols, each transmitted symbol represents 2.5 bits. In this fashion, data transmission speeds may be more than doubled over binary transmission at the same symbol rate using a single channel, albeit at the cost of increased power consumption.

In the receiver for a multi-phase communication system, a frontend circuit decodes the received differential currents to produce the corresponding binary symbol. The six different symbols may be represented by six binary words: [100], [010], [001], [110], [101], and [011]. The bits in these symbols may be represented by the binary variables A, B, and C. For example, the symbol [100] corresponds to A=1, B=0, and C=0. To ensure that one of the three binary variables changes state for every transmitted symbol, no self-transition is allowed. For example, suppose the symbol [001] had just been received. The subsequent symbol cannot be [001] as this would violate the ban against self-transition. In this fashion, a clock can be extracted from every received symbol from the guaranteed binary transition of at least one of the binary signals. In practice, however, the extraction of the clock may be complicated by skew between the binary signals that are generated in the receiver frontend circuit responsive to the differential currents on the transmission lines from the transmitter. To generate the clock, each signal A, B, and C may then drive its own pulse generator as shown in FIG. 1A. The frontend circuit that decodes the differential current transmission to produce the binary data signals A, B, and C is not shown for illustration clarity. An A pulse generator receives the A data signal, a B pulse generator receives the B data signal, and a C pulse generator receives the C data signal. Each pulse generator generates a pulse responsive to each rising and falling edge (binary shift or change) in the corresponding data signal.

An OR gate ORs the generated pulses from the pulse generators to produce the clock signal. FIG. 1B illustrates the resulting signal waveforms for ideal behavior (zero skew between the data signals). The pulse generators are configured to generate a pulse at a fifty percent duty cycle with regard to the data word period such that the resulting clock signal has a 50% duty cycle as well. Since there is a guaranteed binary transition of at least one of the A, B, and C signals every data word period, at least one of the pulse generators will generate a pulse accordingly. For example, both signals A and B have a binary transition at the beginning of a data word period B0. Thus, pulse generator A and pulse generator B both generate a pulse in period B0. Similarly, signals A and C both have a binary transition at the beginning of a subsequent data word period B1 so that the pulse generators A and C pulse accordingly. In another data word period B2, only signal B has a binary transition but only one such transition is necessary for the clock signal to continue cycling. The clock (Bit Clk) generated from the ORing of the pulse generator output signals has the desired cycling in each bit period.

But as signal transmission speeds are increased, it becomes more and more difficult to have the zero skew between signals A, B, and C shown in FIG. 1B. FIG. 1C illustrates the more generic case in which signals A, B, and C become jittered and skewed as they propagate through the receiver at high data rates. For example, in a data word period B0, data signal A transitions synchronously with the beginning of the data word period. But data signal B is skewed with regard to the period boundary such that its transition occurs later. As a result, the ORing of the resulting pulses produces a duty cycle of substantially greater than 50% in period B0. Similar distortion and jitter occurs for the remaining symbol periods as well. The resulting duty cycle distortion and jitter for such a recovered clock produces bit errors when the clock is used to sample the data signals.

Accordingly, there is a need in the art for improved clock generation circuits and techniques for data transmission systems using multi-phase encoding.

SUMMARY

A clock generator is provided for a multi-phase receiver. As used herein, the term "multi-phase" refers to signaling over multiple transmission lines in which the signaling on each transmission line depends upon the signaling over the remaining transmission lines. For example, in a three-phase system, three transmitters drive three transmission lines with either current-mode or voltage-mode signals. The following discussion will assume without loss of generality that transmitters are current-mode transmitters since the concepts and techniques disclosed herein are readily adapted for voltage-mode systems. Each current-mode transmitter either sources current, sinks current, or is inactive. Since the net current must be zero, only two of the three transmitters can be active in sourcing or sinking current for any given symbol transmission. The clock generator discussed herein processes the bit signals from the receiver's frontend circuit. For example, in a three-phase current-mode system, the receiver's frontend circuit determines the current flow direction on the two active lines to generate a three-bit data word having bits that may be designated as A, B, and C. Such frontend circuits are conventional in multi-phase receivers. As data transmission rates are pushed ever higher, these bits become skewed with respect to each other. But the non-overlapping clock generation techniques disclosed herein accommodate this skew without any resulting duty cycle distortion in the clock signal generated from the skew in the data words.

In a three-phase current-mode system in which the sourced or received currents are all equal, the three transmission lines cannot all be active at the same time because then there would not be a net zero transmitted current. So the data word [111] is not allowed. Similarly, the three transmission lines cannot all be inactive as then there would be no transmitted currents. So the data word [000] is also not allowed. There are thus six allowed data words: [001], [010], [100], [110], [101], and [011]. Note that these data words are generated by the receiver frontend circuit after decoding the currents or voltages on the multiple transmission lines. In other words, the data word [001] in which the A and B data bits are each zero and the C data bit equals 1 does not correspond to just one transmission line being active since there must be two active transmitters where one is sourcing current and the other is sinking current. Thus, the data words are bits generated by the receiver's frontend circuit upon decoding the signals received on the transmission lines. Further details regarding the decoding of data words in a multi-phase receiver are discussed in commonly-assigned U.S. application Ser. No. 12/042,362, filed Mar. 5, 2008, the contents of which are incorporated herein in their entirety.

The clock generator includes a pull-down signal generator that processes pairs of bits within each data word to assert one of a plurality of pull-down signals. The pull-down signals correspond on a one-to-one basis with the data words. For example, since there are six possible data words in a three-phase system, there would then be six corresponding pull-down signals. The pull-down signal generator is configured so as to assert the pull-down signal that uniquely corresponds to a current data word.

The clock generator also includes a plurality of pull-down circuits corresponding to the plurality of pull-down signals. Each pull-down circuit responds to the assertion of the corresponding pull-down signal to discharge a common node coupled to all the pull-down circuits. The clock generator further includes a pull-up circuit that functions to recharge the discharged common node back to a power supply voltage. The clock generator generates the clock from this discharging and charging of the common node. In the presence of skew between the bits in a given one of the data words, the pull-down signal generator may assert more than one pull-down signal instead of just asserting the pull-down signal corresponding to the given data word. But this skew does not affect the generated clock because of the relative delays within the pull-down circuits and the pull-up circuit as discussed further herein. These and other advantageous features may be better appreciated through the following detailed description.

DETAILED DESCRIPTION

A non-overlapping clock generator for multi-phase receivers is provided. As used herein, a "multi-phase receiver" denotes a receiver of signals transmitted on a plurality of transmission lines such that any given signal is not independent of the signals on the remaining transmission lines. In contrast, consider conventional signaling on a multi-bit bus—the value of a given bit in a digital word carried on the bus is independent of whether the remaining bits are ones or zeroes. But that is not the case for a multi-phase system. For example, the receiver in a current-mode three-phase system determines the current direction (sourced or received) for the two active lines. The identity of the active transmission line and their current directions forms a received symbol that the receiver frontend circuit decodes into three-bit data words.

Figure 1A:
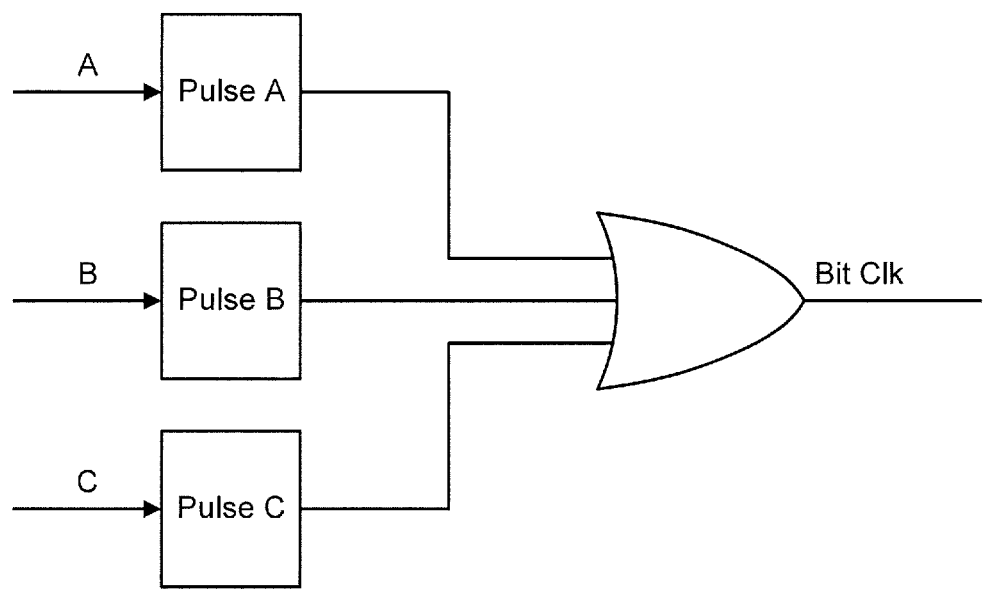
FIG. 1A is a diagram for a conventional multi-phase receiver's clock generation circuit.

The three bits in the data words may be represented by three corresponding variables A, B, C. For example, if the received symbol on the three transmission lines is decoded into the data word [100], then B and C are both zero whereas A is one. As discussed with regards to FIG. 1C, the bits in the data words become skewed with respect to each other at high data transmission rates. Such skew becomes problematic if each bit signal A through C drives its own pulse generator circuit that pulses upon sensing a binary transition of the corresponding bit signal. For example, both signals A and B change binary states from an initial data word [100] to a successive data word [010]. If each signal A and B then drives its own pulse generator circuit as discussed with regard to FIG. 1A, then both pulse generators circuits will pulse from the binary transitions in the corresponding A and B signals. Such plural pulse generation within a single data word period is denoted herein as "overlapping" pulse generation. Such overlapping pulse generation is innocuous if there is no skew between the A, B, and C signals as discussed with regard to FIG. 1B. But there is inevitable skew such as shown in FIG. 1C as the data transmission rates are increased. The overlapping pulses then produce a clock pulse that has a distorted duty cycle. The advantageous clock generation circuit disclosed herein obviates this skew through processing of the data words such that a constant clock duty cycle is achieved despite overlapping pulse generation.

There is no overlapping pulse generation if there is no skew between the bits in the data words. This processing of non-skewed data words will be discussed with regard to a current-mode three-wire system. However, it will be appreciated that the non-overlapping principles disclosed herein may be broadly applied to voltage-mode systems and to multi-phase receivers processing more than three transmission lines. The advantageous processing of the allowed data words [100], [010], [001] will first be discussed. Since there are three bits A, B, and C in each of these words, there are only three distinct pairs of bits that may be formed: A and B, B and C, and A and C. Since each of the preceding data words has just one positive bit, each of these data words has a unique pair of zero bits. For example, in data word [100], B and C are both zero. These bits B and C are not both zero in the other remaining data words. Similarly, in data word [010], bits A and C are both zero but are not both zero in the other remaining data words. The pull-down signal generator for the three pairs of bits may thus comprise a corresponding NOR gate for each bit pair to produce pull-down signals that will be used to generate non-overlapping pulses. In particular, each NOR gate processes its own corresponding bit pair to generate a corresponding pull-down signal that is received by a corresponding pull-down circuit coupled to a common node. Should a NOR gate assert its pull-down signal, the corresponding pull-down circuit discharges the common node for a first pulse duration.

The pull-down signal generator must also accommodate the processing of the remaining three data words [110], [101], and [011]. Each of these remaining data words has a unique pair of two positive bits. For example, bits A and B are both 1 in the data word [110] while these same two bits are not both equal to one for any of the remaining data words. Similarly, the bit pair of B and C are both equal to one in the data word [011] but are not both ones in any of the remaining data words. The pull-down signal generator may thus comprise three AND gates in addition to the three NOR gates just described. Each unique bit pair AB, BC, and AC (note that the order doesn't matter within the bit pairs) drives its own corresponding AND gate that in turn drives a corresponding pull-down circuit coupled to the common node. There are thus six pull-down circuits in a three-wire embodiment: three for the three NOR gates and three for the three AND gates. Three pull-down circuits are driven by corresponding NOR gates that NOR their unique pair of the bits in the current data word. Three remaining pull-down circuits are each driven by corresponding AND gates that AND their unique pair of the bits in the current data word. Each pull-down circuit will pulse the common node low for a first delay period (denoted herein as D1).

Figure 1B:
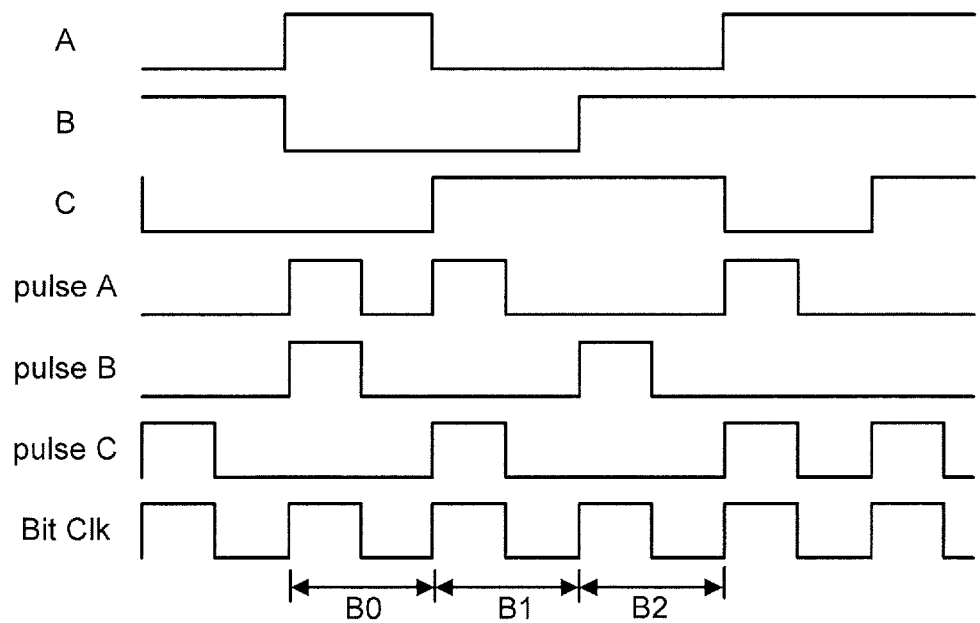
FIG. 1B is a timing diagram for the data signal transitions and the resulting generated pulses and clock for the clock generator of FIG. 1A when the data signals are not skewed.
Figure 1C:
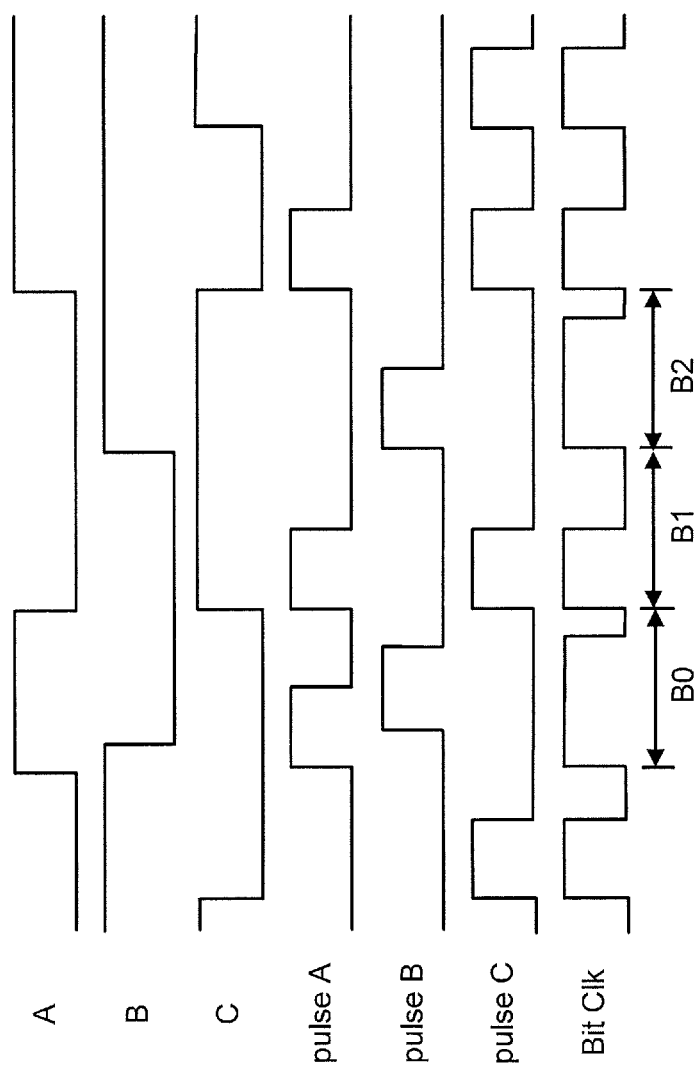
FIG. 1C is a timing diagram for the data signal transitions, generated pulses, and clock for the clock generator of FIG. 1A when the data signals are skewed with respect to each other.

Note the difference with regard to the clock generation discussed with regard to FIG. 1B in which a non-skewed data word triggered overlapping pulse generation. In contrast, the clock generator disclosed herein will pulse only once for each non-skewed data word. There is no overlapping pulsing of the common node if there is no skew in the corresponding digital word. However, such non-skewed digital words become difficult to achieve as the data rates are increased. The clock generation circuit disclosed herein may trigger overlapping discharges of the common node analogous to the overlapping pulses discussed with regard to FIG. 1C in response to skew in the data words. But the resulting overlapping pulses do not introduce duty cycle distortion for the disclosed clock generator so long as the following delay conditions are satisfied. In particular, the skew between the bits in each data word is innocuous so long as the skew does not exceed the first delay period D1. Given such a condition, the maximum length for an overlapping pulse by the triggered pull-down circuits is a sum (D1+TS), where TS is the skew time in the corresponding data word. In that regard, the overlapping pulsing low of the common node may be deemed to being at an initial time. The clock generator includes a pull-up circuit that recharges the common node after the expiration of a second delay period (designated herein as D2) from the initial time. This second delay period is controlled so that D2 is at least twice that of D1. Since D1 is greater than or equal to TS, D2 is thus greater than or equal to the sum of (D1+TS). The pull-up of the common node voltage will thus occur after expiration of the pull-up delay D2 from the start of the delay period D1. Note that TS can vary from data word to data word but the common node will be discharged for the same amount of time—namely, for D2. In other words, so long as the skew time TS is maintained to be less than D1, it has no effect on the pull-down time for the common node. Since the clock generation circuit generates the clock responsive to the discharging and charging of the common node, the skew time TS thus has no effect on the clock duty cycle. These advantageous features may be better appreciated with regard to the following example embodiments.

Figure 2C:
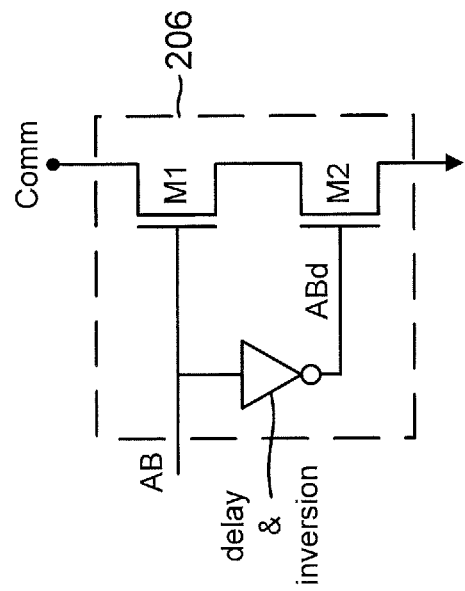
FIG. 2C is a circuit diagram of a pull-down circuit for the clock generation circuit of FIG. 2B.
Figure 2A:
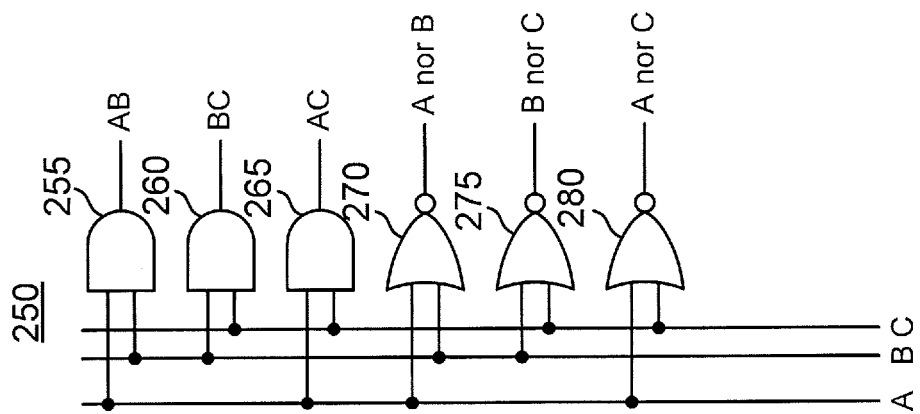
FIG. 2A is a diagram of logic circuits to process the data signals from a multi-phase receiver into corresponding pull-down signals in accordance with an embodiment of the disclosure.

An example pull-down signal generation circuit 250 for processing signals A, B, and C is shown in FIG. 2A. An AND gate 255 processes the A and B bits to produce the product AB. The same pair of bits drives a NOR gate 270 to produce the complement sum (A nor B). Similarly, an AND gate 260 processes the B and C bits to produce the product BC whereas a NOR gate 275 processes this pair of bits to produce the complement sum (B nor C). Finally, an AND gate 265 processes the A and C bits to produce the product AC whereas a NOR gate 280 processes the same bits into the complement sum (A nor C). Each resulting product and complement sum signal functions as a unique pull-down signal that may trigger a pull-down of a common node.

Figure 2B:
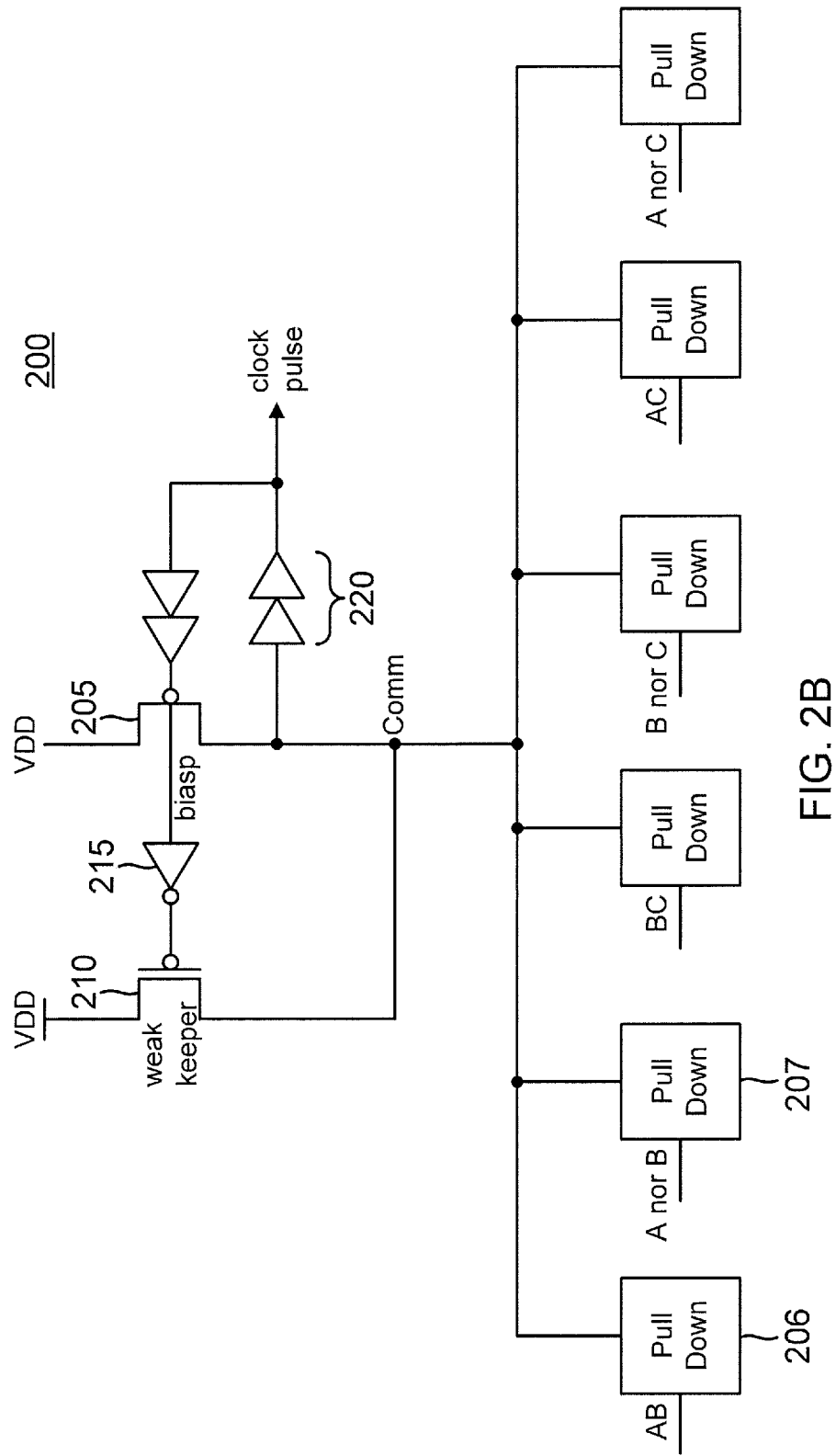
FIG. 2B is diagram of a clock generation circuit that uses the pull-down signals from FIG. 2A to generate a single rate clock in accordance with an embodiment of the disclosure.

A clock generation circuit 200 shown in FIG. 2B includes a pull-down circuit for each pull-down signal. For example, there is a pull-down circuit 206 that receives the product AB. The product AB is thus the pull-down signal that triggers pull-down circuit 206. Similarly, a pull-down circuit 207 receives the complement sum (A nor B), and so on. Each pull-down circuit functions to discharge a common (Comm)

node for a first delay period D1 responsive to its pull-down signal being asserted (equaling binary one in an active high system).

Each pull-down circuit may be identical but for which pull-down signal it processes. Pull-down circuit 206 is shown in more detail in FIG. 2C. Two NMOS transistors M1 and M2 are arranged in series between ground and the Comm node. The pull-down signal (in this case, the AB product) drives the gate of the M1 transistor. The M1 transistor is thus off while the AB product is not asserted. The pull-down signal is inverted and delayed through an inverter to produce a delayed complement AB product (ABd) that drives the gate of the M2 transistor such that the M2 transistor is switched on while the AB product is not asserted. Upon the assertion of the AB product, the M1 transistor switches on but the M2 transistor also stays on due to the delay in the de-assertion of the ABd signal—it is this delay that equals D1. The Comm node will then discharge to ground through the switched on pair of transistors M1 and M2. The signal ABd will not switch low in response to the activation of the pull-down signal AB until after expiration of the delay period D1 whereupon the M2 transistor switches off to stop the discharge of the Comm node. The pull-down signal AB will eventually be de-asserted upon the receipt of the next data word since self-transitions (repetition of the same data word) are not allowed. In this case, the assertion of the pull-down signal AB corresponds to the receipt of the [110] data word. That data word will not be received as the subsequent data word due to the prohibition against self-transition. Thus, the subsequent data word will not be [110] such that the AB pull-down signal is then de-asserted accordingly. In one embodiment, the array of pull-down circuits may be deemed to comprise a means for discharging a common node for a first delay period responsive to each pull-down signal.

The skew between bits in a current data word being processed by clock generation circuit 200 causes overlapping discharge of the Comm node. For example, suppose that the previous data word was [001] and the current data word is [110]. Bits A and B were thus both zero in the previous data word and should change simultaneously to logical ones at the beginning of the current data word. But suppose further that bit B is skewed by the skew time TS with regard to the transition of bit A. The beginning of the current data word would thus actually present as [100] and not change to the proper value of [110] until after the skew time TS has elapsed. The NOR of bits B and C will thus trigger the initial discharge of the Comm node. This discharge would last the delay period D1 except that it is followed by the "correct" discharge of the Comm node as triggered by the AND of bits A and B at time T2 for another delay period D1. The overlapping discharge by the two resulting pull-down signals discharges the Comm node for a period (D1+TS). The Comm node then floats until it is recharged by the pull-up circuit after the delay period D2 has expired from the initial discharge of the Comm node. The skew time TS may vary from data word to data word but has no effect since the pull-up of the Comm node is triggered after the delay time D2, which is greater than or equal to twice the delay period D1 and thus is greater than the sum (D1+TS).

The Comm node voltage may be buffered through a first set of buffers 220 to output the clock signal. In one embodiment, the first set of buffers 220 may be deemed to comprise a means for generating a clock responsive to the charging and discharging of the common node. Buffers 220 may also comprise inverters. The resulting clock pulse may then be used to align the bits in the data words before processing in a de-serializer (not illustrated). The clock pulse also feeds back through another set of buffers 220 to drive the gate of a PMOS transistor 205 as a bias PMOS (biasp) signal. Buffers 220 and PMOS transistor 205 comprise a pull-up circuit for recharging the Comm node voltage back to a power supply voltage VDD. In one embodiment, buffers 220 and PMOS transistor 205 may be deemed to comprise a means for charging the common node to a power supply voltage after a second delay period from the discharge of the common node. The biasp signal is of the same polarity as the voltage of the Comm node and will thus be pulsed low in response to the Comm node voltage after a loop delay D2 resulting from the propagation of the Comm node voltage through buffers 220. PMOS transistor 205 will thus switch on when the biasp signal is discharged. PMOS transistor 205 has its source tied to a power supply node providing a power supply voltage VDD. The drain of PMOS transistor 205 couples to the Comm node so that the Comm node voltage is raised to VDD in response to the discharge of the biasp signal. The assertion of the Comm node voltage then propagates through buffers 220 according to the loop delay D2 to switch off PMOS transistor 205 from the assertion of the biasp signal.

In alternative embodiments, the delay time D2 may be configured so as to be just greater than or equal to D1 as opposed to being twice D1. In such embodiments, the pull-up of the Comm node voltage may overlap with the pull-down of Comm node voltage. Thus, in embodiments in which the delay period D2 is not greater than or equal to twice D1, PMOS transistor 205 may be made relatively large as compared to NMOS transistors M1 and M2.

To keep the Comm node from floating when the PMOS transistor 205 is off, the biasp signal is inverted through an inverter 215 to drive the gate of a weak keeper PMOS transistor 210. The source of the weak keeper PMOS transistor 215 couples to the power supply node VDD and its drain couples to the Comm node. The weak keeper PMOS transistor 210 thus functions to weakly charge the Comm node voltage to VDD when the PMOS transistor 205 is off. The NMOS transistors M1 and M2 in each pull-down circuit are relatively strong compared to weak PMOS transistor 210 and thus can discharge the Comm node voltage despite the weak keeper PMOS transistor 210 being switched on.

Figure 3A:
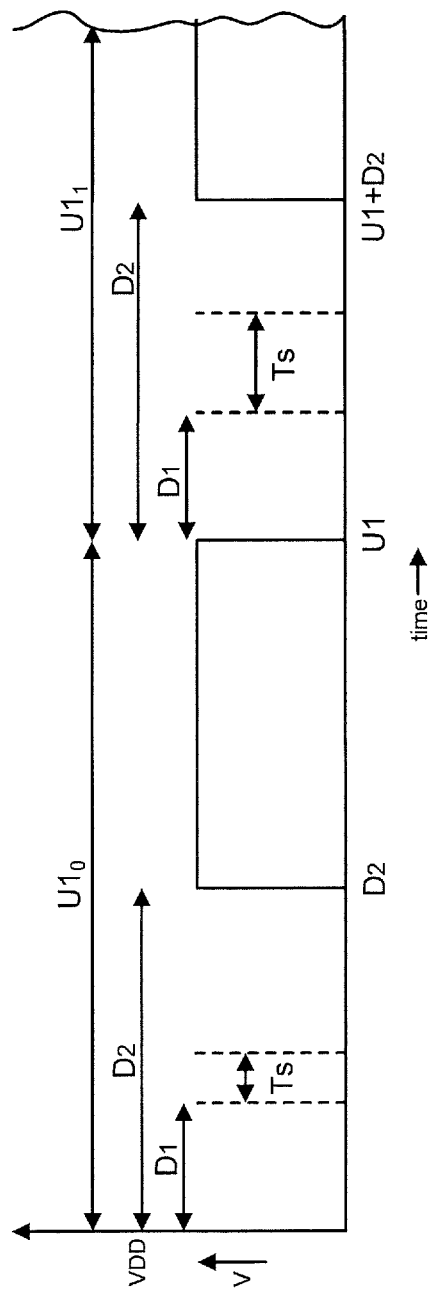
FIG. 3A is a timing diagram for the common node voltage in the clock generation circuit of FIG. 2B.
Figure 3B:
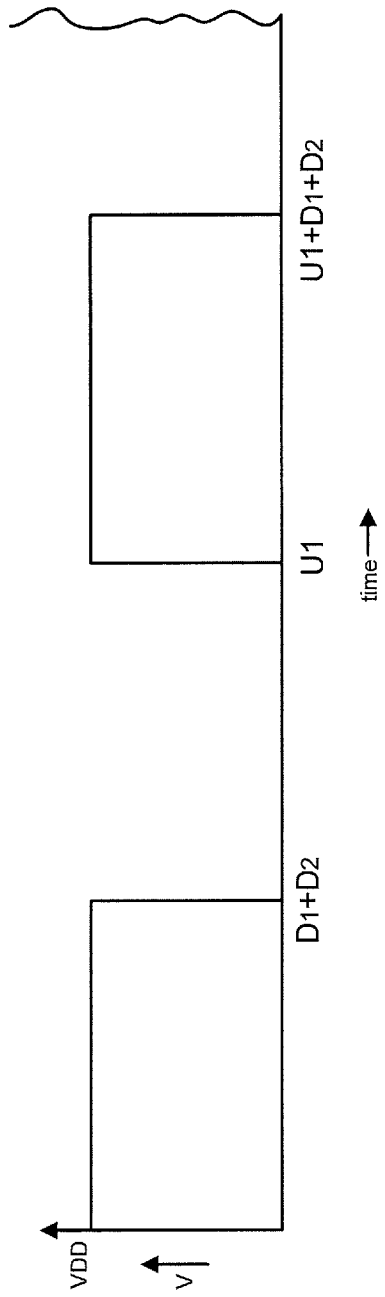
FIG. 3B is a timing diagram for the clock signal generated from the common node voltage of FIG. 3A.

Some example timing for the Comm node voltage is shown in FIG. 3A for an initial data word $U1_0$ followed by a subsequent data word $U1_1$. The resulting clock signal voltage is shown in FIG. 3B. Each data word has a bit period U1. With regard to the beginning of each data word, the Comm node voltage is discharged for the period D2 as discussed previously. In reality, the Comm node voltage does not float as shown subsequent to the expiration of the pull-down time (D1+TS) but instead would be weakly charged by weak keeper transistor 210. But note that the inverters that constitute buffers 220 have a threshold voltage of approximately VDD/2 with regard to their inversion. So long as the weak pull-up of the Comm node does not rise above this threshold voltage, it may be ignored with regard to the release of the pull-down on the Comm node voltage by the corresponding pull-down circuits until the Comm node voltage is strongly charged back to VDD after the expiration of the D2 delay period. Accordingly, the weak pull-up by weak keeper transistor 210 is not shown in FIG. 3A in that it has no effect on the resulting clock signal generation. In addition, note that the clock signal does not respond to the discharge of the Comm node voltage until whatever delay is required to propagate this voltage change through the first set of buffers 220 has expired. This delay is not shown in FIG. 3B for illustration clarity.

As shown in FIG. 3A, the skew time TS may vary widely from data word to data word but so long the sum of (D1+TS) is less than D2, this varying skew has no effect on the resulting clock generation. One can readily appreciate that the bit period U1 may be greater than or equal to twice D2 because it takes two loop delays D2 for the PMOS transistor 205 to be switched off in anticipation for the subsequent data word. If the bit period were less than twice D2, PMOS transistor 205 would not be reset prior to the arrival of the subsequent data word. In alternative embodiments, the bit period U1 may be less than twice the delay period D2.

Figure 4:
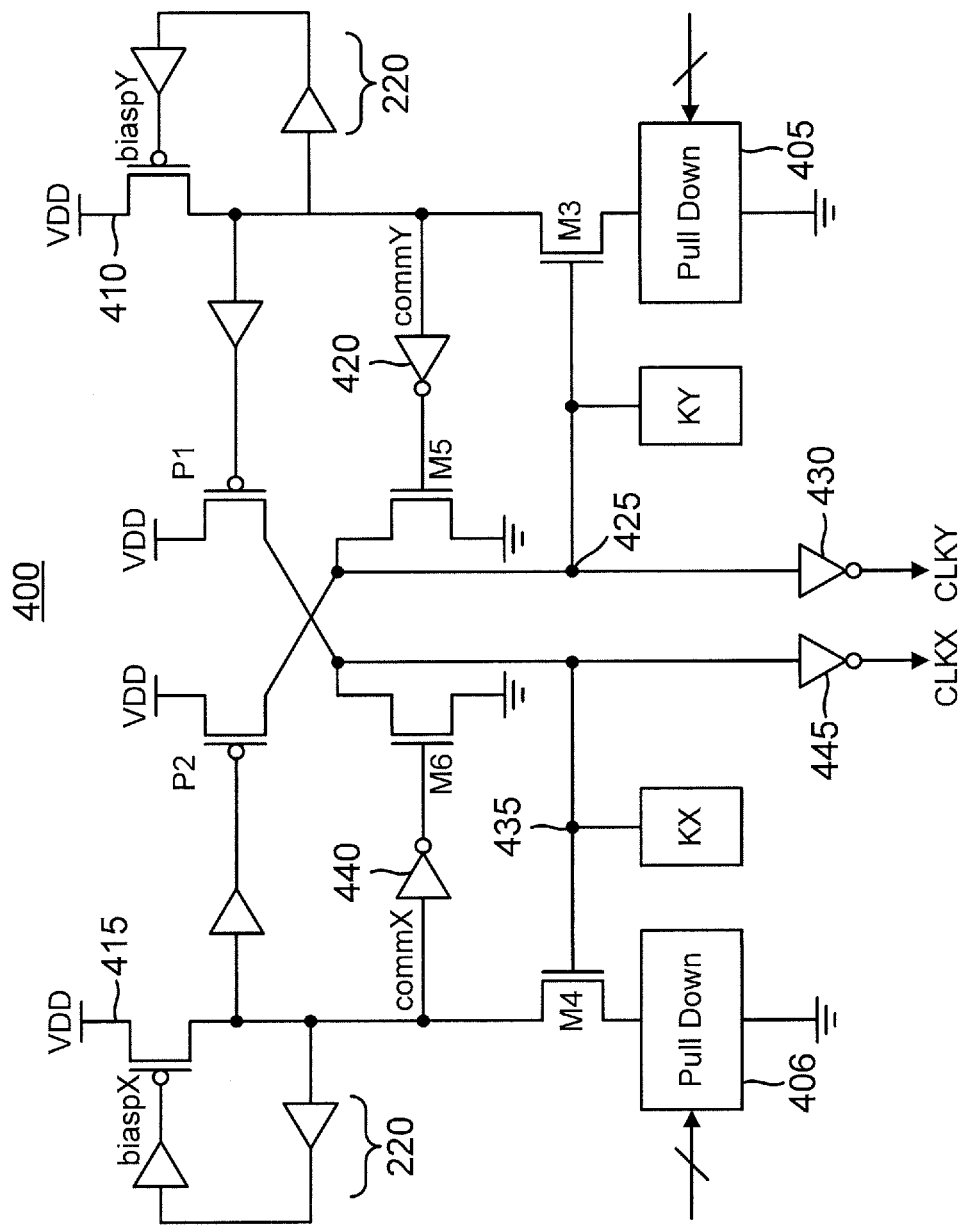
FIG. 4 is a diagram of a clock generation circuit that uses the pull-down signals of FIG. 2A to generate two half rate clocks in accordance with an embodiment of the disclosure.

Designing buffers 220 so that the bit period U1 equals at least twice the delay period D2 may become problematic as the data transmission speeds are increased. As the data rates are increased, the delay period interval U2 (and thus the delay period D1) must shrink accordingly. But the receiver may be located in, for example, a DRAM integrated circuit that uses a relatively slow semiconductor process. In contrast, the transmitter may be located in, for example, a system-on-a-chip (SOC) that uses a much faster CMOS semiconductor process. The receiver may thus be unable to generate a delay period D2 that is one half or less than the data interval. To satisfy the required timing, two half-rate clocks may be generated. An example half-rate clock generator 400 for a pair of half-rate clocks CLKY and CLKX is shown in FIG. 4. A first pull-down circuit 405 represents the six pull-down circuits discussed with regard to clock generator 200. Similarly, these six pull-down circuits are duplicated in a second pull-down circuit 406. Each pull-down circuit couples to a corresponding Comm node. However, this coupling is through a switch NMOS transistor rather than a direct coupling as discussed with regard to clock generator 200. In that regard, pull-down circuit 405 couples to a CommY node through a switch NMOS transistor M3. Similarly, pull-down circuit 406 couples to a CommX node through a switch NMOS transistor M4.

Switch transistors M3 and M4 are switched in a complementary fashion through a pair of PMOS transistors P1 and P2. The CommY node couples through a buffer to the gate of P1 transistor, which has its source coupled to a power supply node providing the power supply voltage VDD and its drain coupled to the gate of the switch transistor M4. If the CommY node is pulsed low through its pull-down circuit 405, the P1 transistor will thus charge the gate of the switch transistor M4 to ensure that pull-down circuit 406 can discharge the CommX node when the next data word is received. At the same time, an inverter 420 inverts the low voltage of the CommY node to switch on an NMOS transistor M5. The source of transistor M5 couples to ground whereas its drain couples to the drain of the transistor P2 and also to a node 425 that couples to the gate of switch transistor M3. The switching on of transistor M5 thus grounds node 425 to switch off switch transistor M3. An inverter 430 inverts the voltage of node 425 to drive a clock Y (CLKY) signal high in response to the pulsing low of the CommY node.

The pulsing low of the CommY node then propagates through the delay 2 loop delay provided by buffers 220 to pull a biaspY signal low that drives the gate of a PMOS transistor 410. Transistor 410 is analogous to PMOS transistor 205 discussed previously in that transistor 410 has its source tied to the power supply node and a drain coupled to the CommY node. The pulsing low of the CommY node is thus ended after the expiration of the loop delay D2 by transistor 410, which then conducts to charge the CommY node back to VDD. This charging of the CommY node then switches off transistor M5 to stop the discharge of node 425. Thus, node 425 will go high after transistor M5 goes off to pull the CLKY signal low. A weak keeper device KY such as a PMOS transistor functions to weakly charge node 425 to VDD.

Another weak pull-up device KY functions to weakly charge a node 435 to VDD. Node 435 couples to the gate of switch transistor M4. At the receipt of the next data word, pull-down device 406 can thus discharge the CommX node because switch transistor M4 will be on. The pulsing low of the CommX node voltage is inverted through an inverter 440 that then drives the gate of a transistor M6 to switch transistor M6 on. The source of transistor M6 couples to ground whereas its drain couples to node 435 and to the drain of transistor P1. Transistor P1 is off at this time so the switching on of transistor M6 grounds node 435. An inverter 445 inverts the voltage for node 435 to drive a clock X (CLKX) signal high. The pulsing high of the CLKX signal is brought low after the expiration of a loop delay through buffers 220 to pull a biaspX signal low to switch on a PMOS transistor 415. Transistor 415 has its source tied to the power supply node and a drain coupled to node 425. The switching on of transistor 415 then charges the CommX node to VDD, which switches off transistor M6. Node 435 is then weakly charged back to VDD so that the CLKX signal is pulsed low.

Whenever one of the clock signals CLKX or CLKY goes high, note that the remaining clock signal is driven low by the feedback through the P1 or P2 transistors. For example, if the CLKX signal is high because the CommX node has been pulsed low, then the transistor P2 is switched on charge node 425 high. The high voltage for node 425 is then inverted through inverter 430 to drive the CLKY signal low. Similarly, if the CKLY clock signal is pulsed high, then the CommY node is low, which switches on transistor P1 to pulls node 435 high. This high voltage is inverted through inverter 445 to drive the CLKX signal low.

Referring again to the loop delay D2 through buffers 220 whenever one of the Comm X or CommY nodes is pulsed low, note that it need not be ½ or less than the unit interval for each data word. In contrast, signal generator 200 required such a relationship between the loop delay D2 and the unit interval. But the half-rate clock generator 400 may relax this requirement because the clocks reset each as just discussed. For example, the CommX node need not be recharged to VDD before the subsequent data word is received since the subsequent data word will be used to discharge the CommY node instead. Thus, buffers 220 may be relatively slow such that the loop delay D2 need merely be less than or equal to the unit interval.

Half-rate clock generator 400 may be generalized in alternative embodiment to generate other fractional clock rates. Referring back to the feedback through the P1 and P2 transistors, this pulsing of the nodes 425 and 435 may be thought of as passing of a token in a token ring. If one of the nodes is pulsed low, the next node in the token ring is pulsed high. This subsequent node in the token ring would then be discharged upon receipt of the next data word, whereupon the token is passed to the subsequent stage to the subsequent stage, and so on. For example, if there are three such stages, each stage could generate a ⅓ rate clock.

Figure 5:
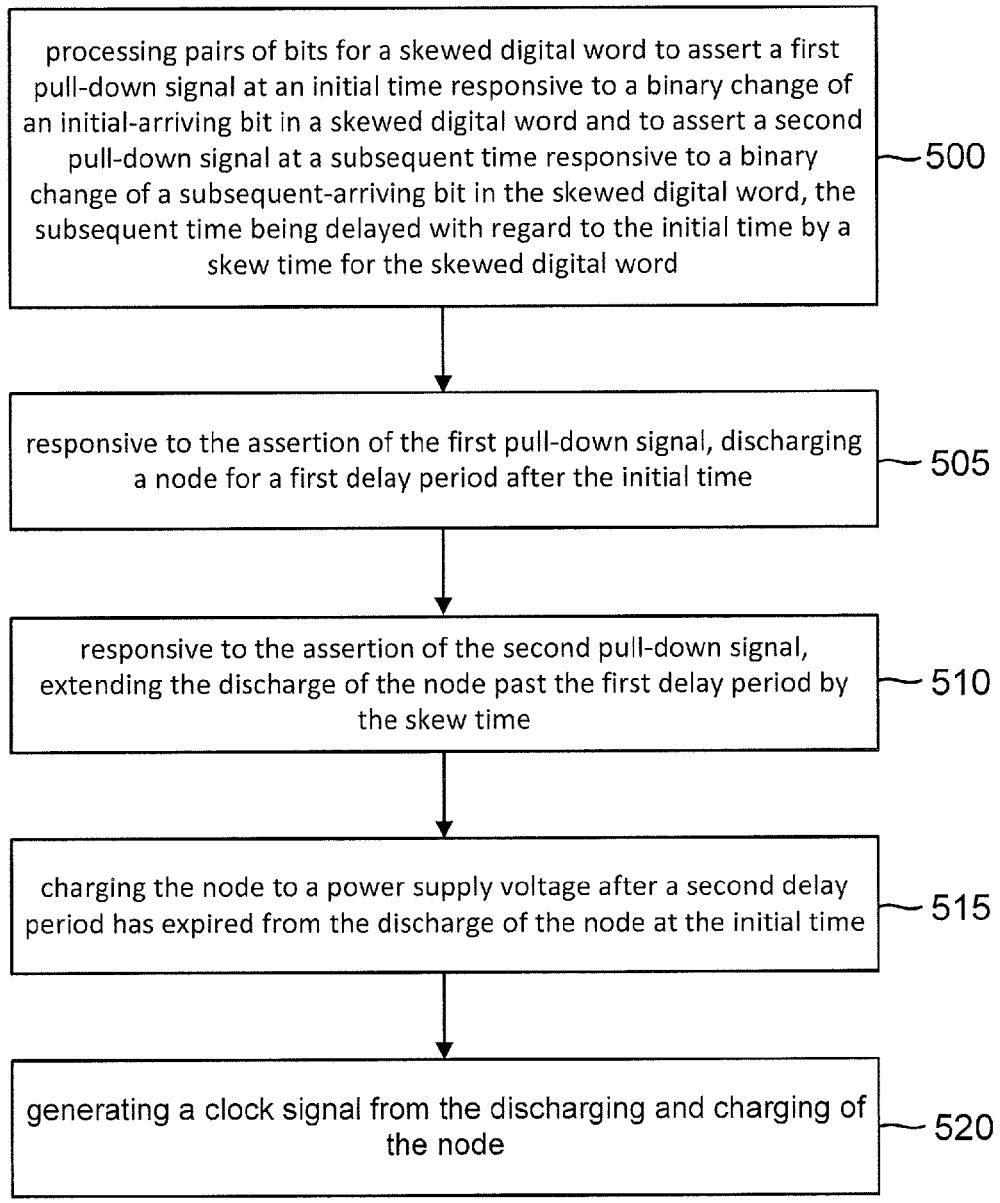
FIG. 5 is a flowchart for a method of use of a clock generation circuit in accordance with an embodiment of the disclosure.

A method of generating a clock will now be discussed with regard to the flowchart shown in FIG. 5. A step 500 comprises processing pairs of bits for a skewed digital word to assert a first pull-down signal at an initial time responsive to a binary change of an initial-arriving bit in a skewed digital word and to assert a second pull-down signal at a subsequent time responsive to a binary change of a subsequent-arriving bit in the skewed digital word, the subsequent time being delayed with regard to the initial time by a skew time for the skewed digital word. An example of the first pull-down signal is discussed above with regard to the receipt of a data word that is supposed to be received as [110] but because of skew is initially received as [100]. NORing bits B and C would initially trigger a first pull-down signal when bit C transitions low that would be followed by the ANDing of bits A and B when bit B finally transitions high to trigger a second pull-down signal.

The method also includes an act 505 that is responsive the assertion of the first pull-down signal and comprises discharging a node for a first delay period after the initial time. The discharge of the Comm node voltage at the beginning of data word $U1_0$ for a period D1 discussed with regard to FIG. 3A is an example of act 505.

The method also includes an act 510 that is responsive to the assertion of the second pull-down signal and comprises extending the discharge of the node past the first delay period by the skew time. This skew time is denoted as TS as discussed with regard to FIG. 3A is an example of act 510.

The method also includes an act 515 of charging the node to a power supply voltage after a second delay period has expired from the discharge of the node at the initial time. The charging of the Comm node voltage to VDD after expiration of the D2 delay period as discussed above with regard to FIG. 3A is an example of act 515.

Finally, the method includes an act 520 of generating a clock signal from the charging and discharging of the node. The generation of the clock in the clock generator 200 of FIG. 2B is an example of act 520.

It will thus be appreciated that many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A circuit, comprising:
   a pull-down signal generator including a plurality of logic gates corresponding to a plurality of pull-down signals, each logic gate being configured to process a pair of bits from received digital words to assert the corresponding pull-down signal;
   a plurality of pull-down circuits corresponding to the plurality of pull-down signals, wherein each pull-down circuit includes:
      a first NMOS transistor having a gate driven by the corresponding pull-down signal and a drain coupled to a common node;
      an inverter configured to invert the corresponding pull-down signal into a delayed pull-down signal; and
      a second NMOS transistor coupled between ground and a drain of the first NMOS transistor and having a gate driven by the delayed pull-down signal, wherein the inverter is configured to delay the delayed pull-down signal such that the pull-down circuit is configured to discharge the common node for a first delay period after the assertion of the corresponding pull-down signal;
   wherein the circuit further comprises a pull-up circuit including a PMOS transistor coupled between the common node and a power supply node providing a power supply voltage, the pull-up circuit also including at least one buffer coupled between the common node and a gate of the PMOS transistor, wherein the at least one buffer is configured to switch on the PMOS transistor to bias the common node to the power supply voltage after a second delay period from the discharge of the common node, and wherein the second delay period is greater than or equal to a sum of the first delay period and an expected skew time for the received digital words; and
   wherein the circuit is located in a receiver configured to use a clock signal derived from the discharge and bias of the common node responsive to each digital word.

2. The circuit of claim 1, wherein the plurality of logic gates comprise a first plurality of AND gates and a second plurality of NOR gates.

3. The circuit of claim 1, wherein each pull-down circuit's inverter further comprises a buffer configured to delay the inverter's delayed pull-down signal such that the first delay period is greater than or equal to an expected skew between bits in the digital words.

4. The circuit of claim 1, wherein the at least one buffer comprises a plurality of buffers configured so that the second delay period is greater than or equal to twice the first delay period.

5. The circuit of claim 1, wherein the receiver is part of an integrated circuit for a dynamic random access memory (DRAM).

6. The circuit of claim 1, further comprising a keeper device configured to charge the common node to the power supply voltage responsive to the discharge of the delayed signal.

7. The circuit of claim 6, wherein the keeper device comprises a keeper device PMOS transistor.

8. The circuit of claim 7, further comprising an inverter configured to invert the delayed signal into an inverted signal that drives a gate of the keeper device PMOS transistor.

9. A method, comprising:
   receiving a digital word in which a first bit and a third bit both have a binary change at an initial time and in which a second bit has a binary change at a subsequent time, the subsequent time being delayed with regard to the initial time by a skew time for the received digital word;
   processing the second bit and the third bit in the received digital word through a first logic gate to assert a first pull-down signal responsive to the binary change of the third bit at the initial time;
   processing the first bit and the second bit in the received digital word through a second logic gate to assert a second pull-down signal responsive to the binary change of the second bit at the subsequent time;
   responsive to the assertion of the first pull-down signal, discharging a node for a first delay period after the initial time;
   responsive to the assertion of the second pull-down signal, maintaining the discharge of the node past the first delay period by the skew time;
   charging the node to a power supply voltage after a second delay period has expired from the discharge of the node at the initial time, wherein the second delay period is greater than a sum of the first delay period and the skew time; and
   generating a clock signal from the discharging and charging of the node.

10. The method of claim 9, wherein discharging the node for the first delay period comprises turning on a first transistor responsive to the assertion of the selected pull-down signal to couple the node to ground though a second transistor.

11. The method of claim 10, wherein discharging the node for the first delay period further comprises inverting and delaying the asserted pull-down signal by the first delay period to produce a delayed pull-down signal that switches off the second transistor to prevent further discharge of the node.

12. The method of claim 9, wherein charging the node to the power supply voltage comprises buffering a voltage for the node through at least one buffer to create a delayed discharged signal that switches on a switch after the expiration of the second delay period to couple the node to a power supply node supplying the power supply voltage.

13. A circuit, comprising:
 a pull-down signal generator including a plurality of logic gates corresponding to a plurality of pull-down signals, each logic gate being configured to process a pair of bits from received digital words to assert the corresponding pull-down signal;
 a pull-down signal generator including a plurality of logic gates corresponding to a plurality of pull-down signals, each logic gate being configured to process a pair of bits from received digital words to assert the corresponding pull-down signal;
 a plurality of pull-down circuits corresponding to the plurality of pull-down signals, wherein each pull-down circuit includes:
  a first NMOS transistor having a gate driven by the corresponding pull-down signal and a drain coupled to a common node;
  an inverter configured to invert the corresponding pull-down signal into a delayed pull-down signal; and
  a second NMOS transistor coupled between ground and a drain of the first NMOS transistor and having a gate driven by the delayed pull-down signal, wherein the inverter is configured to delay the delayed pull-down signal such that the pull-down circuit is configured to discharge the common node for a first delay period after the assertion of the corresponding pull-down signal;
 means for charging the common node to a power supply voltage after a second delay period from the discharge of the common node; and
 means for generating a clock responsive to the charging and discharging of the common node.

14. The circuit of claim 13, wherein the means for generating a clock comprises a means for generating a fractional-rate clock.

15. The circuit of claim 13, wherein the means for generating a clock comprises a means for generating a half-rate clock.

* * * * *